United States Patent
Nagasaka

(10) Patent No.: US 9,664,856 B2
(45) Date of Patent: May 30, 2017

(54) LIGHT DIVIDER AND MAGNETISM MEASUREMENT APPARATUS

(71) Applicant: SEIKO EPSON CORPORATION, Tokyo (JP)

(72) Inventor: Kimio Nagasaka, Hokuto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 213 days.

(21) Appl. No.: 14/532,616

(22) Filed: Nov. 4, 2014

(65) Prior Publication Data

US 2015/0123653 A1    May 7, 2015

(30) Foreign Application Priority Data

Nov. 6, 2013 (JP) ................................ 2013-230180

(51) Int. Cl.
| | |
|---|---|
| *G01R 33/032* | (2006.01) |
| *G02B 6/26* | (2006.01) |
| *G02B 27/14* | (2006.01) |
| *G02B 27/10* | (2006.01) |

(52) U.S. Cl.
CPC ........... *G02B 6/262* (2013.01); *G01R 33/032* (2013.01); *G02B 27/106* (2013.01); *G02B 27/144* (2013.01)

(58) Field of Classification Search
CPC ..... G02B 6/262; G02B 27/144; G01R 33/032
USPC ....................................................... 324/244
See application file for complete search history.

(56) References Cited

U.S. PATENT DOCUMENTS

| | | | | |
|---|---|---|---|---|
| 5,309,456 | A * | 5/1994 | Horton | .................. H01S 3/0057 372/25 |
| 5,619,601 | A * | 4/1997 | Akashi | .................. G02B 27/28 385/11 |
| 7,798,660 | B2 | 9/2010 | Itoh et al. | |
| 2006/0065820 | A1* | 3/2006 | Nagai | .................. G01R 33/032 250/225 |
| 2008/0247150 | A1* | 10/2008 | Itoh | ....................... G02B 6/0028 362/19 |
| 2011/0101974 | A1* | 5/2011 | Nagasaka | .......... G01R 33/0322 324/244.1 |
| 2013/0093421 | A1* | 4/2013 | Ueno | .................... G01R 33/032 324/260 |

FOREIGN PATENT DOCUMENTS

| | | |
|---|---|---|
| JP | A-7-199236 | 8/1995 |
| JP | A-2008-277279 | 11/2008 |
| JP | A-2009-258656 | 11/2009 |

\* cited by examiner

*Primary Examiner* — Son Le
*Assistant Examiner* — Akm Zakaria
(74) *Attorney, Agent, or Firm* — Oliff PLC

(57) ABSTRACT

A light divider includes a light guide having a first surface and a second surface that reflect light incident on the light guide, the light guide causing the light to propagate through a portion between the first surface and the second surface, light dividing films that are provided in the light guide and so characterized that the light dividing films not only reflect but also transmit the light, and a plurality of light extracting portions that are provided on the first surface and allow light fluxes that the light dividing films have transmitted to exit through the first surface.

5 Claims, 3 Drawing Sheets

LIGHT DIVIDER AND MAGNETISM MEASUREMENT APPARATUS

This application claims the benefit of Japanese Patent Application No. 2013-230180, filed on Nov. 6, 2013. The content of the aforementioned application is incorporated herein by reference in its entirety.

BACKGROUND

1. Technical Field

The present invention relates to a light divider and a magnetism measurement apparatus.

2. Related Art

There is a known optical sensor array in which a plurality of optical sensors are arranged and each of them optically measures a physical quantity (physical state). An optical sensor array using optically-pumped magnetism sensors as the optical sensors is used, for example, in a magnetocardiograph, which measures a magnetic field produced by the heart of a living organism, and a magnetoencephalograph. To operate the optical sensor array, light from a light source needs to be divided into light fluxes, which need to be incident on the optical sensors. For example, JP-A-2008-277279 discloses a technology in which a plurality of polarizing beam splitters (PBSs) are disposed and divide laser light into a large number of light fluxes.

The transmittance (or reflectance) of a polarizing beam splitter typically varies by about several percent. Therefore, when light repeatedly passes through a plurality of polarizing beam splitters, it is difficult to make the amounts of divided light fluxes the same due to an accumulated transmittance error.

SUMMARY

An advantage of some aspects of the invention is to provide a technology for making the amounts of divided light fluxes closer to one another.

An aspect of the invention provides a light divider including a light guide having a first surface and a second surface that reflect light incident on the light guide, the light guide causing the light to propagate through a portion between the first surface and the second surface, light dividing films that are provided in the light guide and so characterized that the light dividing films not only reflect but also transmit the light, and a plurality of light extracting portions that are provided on the first surface and allow light fluxes that the light dividing films have transmitted to exit through the first surface.

The light divider with this configuration, when compared with a method for successively dividing a light flux by using arranged transmissive/reflective prisms, diffraction gratings, or any other light dividing elements, can stably provide more uniform divided light fluxe.

The light guide may have a layer structure including a plurality of layers, and each of the light dividing films may be provided between adjacent two layers of the plurality of layers.

The light divider with this configuration, which is formed of a plurality of stacked layers, can stably provide more uniform divided light fluxes.

The plurality of layers may be formed of n layers, and among the n layers, the number of light dividing films provided between an (i+1)-th layer and an (i+2)-th layer may be twice the number of light dividing films provided between an i-th layer and the (i+1)-th layer.

The light divider may further include a beam shifter that is provided in the light guide and translates the optical path of the light.

The light divider with this configuration can provide a plurality of divided light fluxes separated at equal intervals.

The light divider may further include a structural component that is provided over the entire first surface and extracts light fluxes having propagated through the light guide and reflection films that are provided on the first surface in at least part of portions excluding the plurality of light extracting portions.

According to the light divider with this configuration, the manufacturing cost can be lowered as compared with a case where the structural component is formed on a light extracting portion basis.

Each of the plurality of light extracting portions may be formed of a plurality of structural components that extract a light flux having propagated through the light guide, and the sets of plurality of structural components may be arranged at equal intervals.

The light divider with this configuration can provide a plurality of divided light fluxes without formation of a total reflection film on the light guide.

Another aspect of the invention provides a magnetism measurement apparatus including a light guide having a first surface and a second surface that reflect light incident on the light guide, the light guide causing the light to propagate through a portion between the first surface and the second surface, light dividing films that are provided in the light guide and so characterized that the light dividing films not only reflect but also transmit the light, a plurality of light extracting portions that are provided on the first surface and allow light fluxes that the light dividing films have transmitted to exit through the first surface, and a plurality of gas cells provided in positions corresponding to the plurality of light extracting portions, each of the plurality of gas cells encapsulating a gas that interacts with a magnetic field and a light flux extracted through the corresponding light extracting portion.

The magnetism measurement apparatus can more precisely measure a magnetic field.

BRIEF DESCRIPTION OF THE DRAWINGS

The invention will be described with reference to the accompanying drawings, wherein like numbers reference like elements.

DESCRIPTION OF EXEMPLARY EMBODIMENTS

1. First Embodiment

Figure 1:
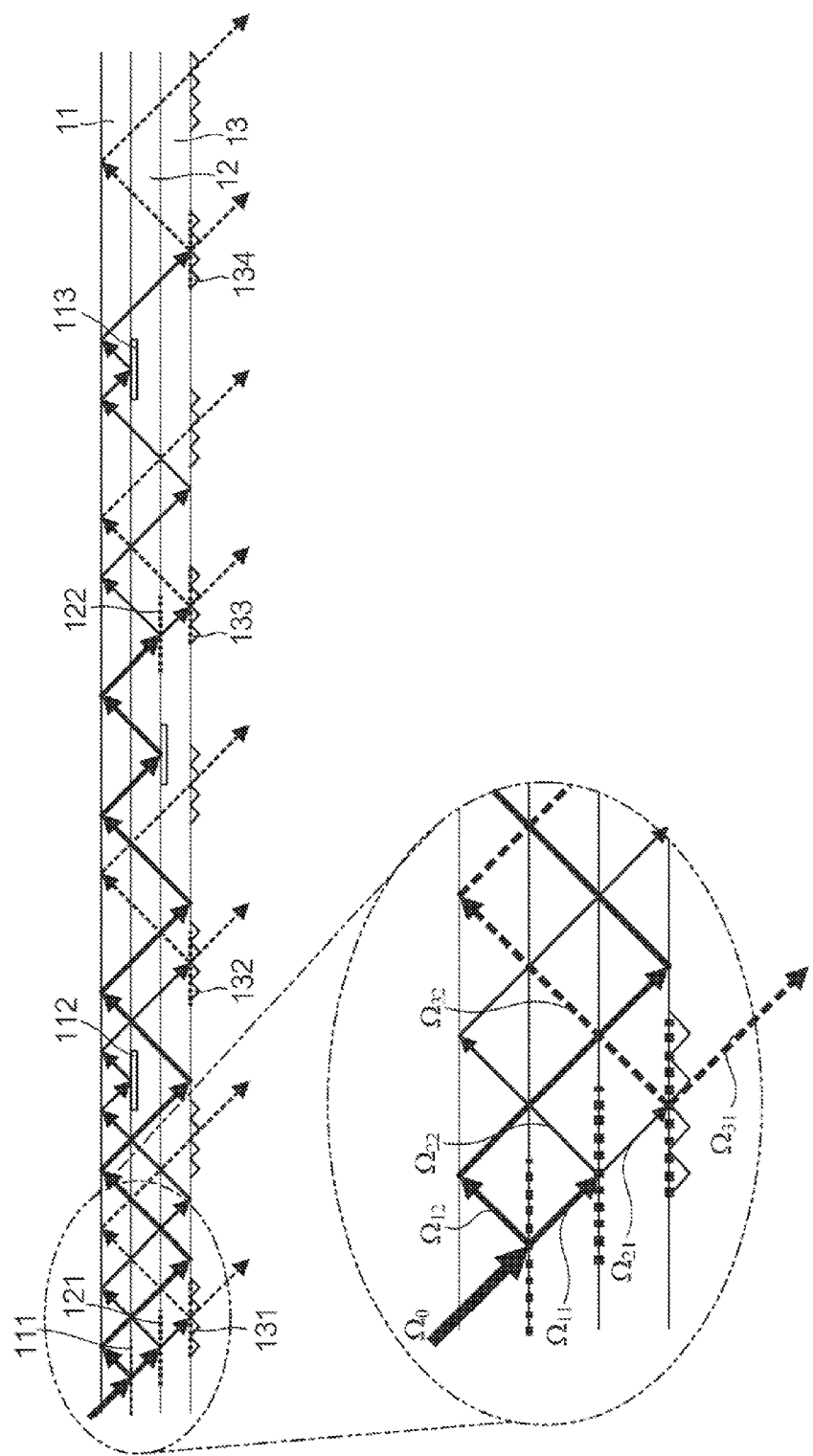
FIG. 1 shows the configuration of a light divider according to a first embodiment.

FIG. 1 shows the configuration of a light divider 1 according to a first embodiment. The light divider 1 is an apparatus that divides a single light flux incident thereon into a plurality of light fluxes. The first embodiment relates to a case where incident light is divided into eight light fluxes. FIG. 1 is a diagrammatic view of a cross section viewed along a direction perpendicular to the optical path of the incident light. The incident light is outputted from a light source (not shown). The light source includes, for example, a semiconductor laser diode. Since laser light typically has a Gaussian intensity distribution, a beam homogenizer may be used to homogenize the intensity distribution of the outputted light.

The light divider 1 has three substrates (substrate 11, substrate 12, and substrate 13) that serve as a light guide. Each of the substrates is a flat plate having surfaces parallel to each other and made of a light transmissive material (quartz glass or borosilicate glass, for example). The substrates are bonded to each other with an adhesive. The adhesive, after it cures, preferably has a refractive index substantially equal to that of the substrates. The difference in the refractive index between the light guide and air allows each of the surfaces (upper and lower surfaces in FIG. 1) of the light guide to serve as a total reflection surface (excluding light extracting portions, which will be described later). The light having entered the light guide propagates from left to right in FIG. 1 while repeatedly reflected off the upper and lower surfaces of the light guide. Part of the propagating light is extracted as a light flux out of the light guide through a light extracting portion. To ensure that each of the surfaces of the light guide is a total reflection surface, a metal thin film or a dielectric thin film may be formed on the surface.

The light divider 1 further has a plurality of semi-reflection films. Each of the semi-reflection films is a film that reflects part of the propagating light and transmits part thereof. That is, each of the semi-reflection films is an example of a light dividing film so characterized that it not only reflects but also transmits light. In this example, the light divider 1 has seven reflection films (semi-reflection films 111, 121, 122, 131, 132, 133, and 134). Each of the semi-reflection films has a reflectance of 50% (transmittance of 50%). In an actual situation, an optical loss occurs at a semi-reflection film, but it is assumed in the description that each of the semi-reflection films is an ideal semi-reflection film that produces no loss for ease of description. Each of the semi-reflection films is provided at the interface between two substrates or the interface between a substrate and air. Each of the semi-reflection films is, for example, a dielectric thin film or a diffraction grating pattern formed on a substrate. The semi-reflection film provided at the interface between two substrates may be formed on either one of the substrates. For example, the semi-reflection film 111 may be formed on the substrate 11 or the substrate 12.

The number of substrates and the number of reflection films in the light divider 1 are determined in accordance with the number of light fluxes (divided light fluxes) to be outputted. To output N light fluxes (to divide incident light into N light fluxes), the number of substrates (the number of layers) that form the light guide is $\log_2 N$. For example, when N=8 (divided into 8), the light guide has a three-layer structure including three substrates. When N=16 (divided into 16), the light guide has a four-layer structure including four substrates.

Among the layers, the number of semi-reflection films on a certain layer is twice the number of semi-reflection films on the layer immediately upstream along the optical path of the incident light. That is, the number of semi-reflection films provided between an (i+1)-th layer and an (i+2)-th layer is twice the number of semi-reflection films provided between an i-th layer and the (i+1)-th layer. In the example shown in FIG. 1, the number of reflection films changes as follows: one (semi-reflection film 111); two (semi-reflection films 121 and 122); and four (semi-reflection films 131, 132, 133, and 134) sequentially from the light incident side.

When N is not a power of 2 (when $\log_2 N$ is not an integer), the number of substrates that form the light guide is obtained by rounding up the fractional portion of $\log_2 N$. For example, when N=10 (divided into 10), four substrates are used, and 10 out of the 16 divided light fluxes may be outputted.

The light divider 1 further includes a beam shifter. The beam shifter is an optical element for translating the optical path of the light flux propagating through the light guide in order to set the interval (distance) between a plurality of light fluxes outputted through the light extracting portions, which will be described later, at a preset value. In this example, the beam shifter is a total reflection layer. In this example, the light divider 1 has three beam shifters (beam shifters 112, 113, and 123). Each of the beam shifters is formed, for example, of an air layer. The air layer is formed by forming a recess in a substrate. Each of the beam shifters is not limited to a beam shifter formed of an air layer. Each of the beam shifters may be made of a material other than air but having a refractive index smaller than that of the substrate.

The light divider 1 further has light extracting portions. Each of the light extracting portions is a structure for extracting a light flux divided from the light flux having propagated through the light guide. Each of the light extracting portions has a structural component for extracting the light flux. The structural component is, for example, a diffraction grating, a one-dimensional grating having a triangular wave cross-sectional shape, or triangular prisms. In this example, the light divider 1 has eight light extracting portions (light extracting portions 141 to 148). The number of light extracting portions provided in the light divider 1 is equal to the number of light fluxes to be outputted from the light divider 1. The structural components that form the light extracting portions are provided on a light extracting portion basis. That is, in this example, eight structural components (triangular prisms, for example) are used. The structural components are disposed at equal intervals.

The action of the light divider 1 will next be described. The incident light supplied from the light source is a parallelized light flux. Incident light $\Phi_0$ is incident on the upper surface of the light guide at a predetermined angle of incidence $\theta$ ($\theta=45°$ in the example shown in FIG. 1). A triangular prism having a surface inclined to the upper surface of the light guide by the angle $\theta$ equal to the angle of incidence may be attached to a portion on which the incident light $\Phi_0$ is incident. The light incident on the light guide propagates at the angle $\theta$ through the light guide.

The incident light $\Phi_0$ is first divided into two light fluxes (light flux $\Phi_{11}$, which is transmitted light, and light flux $\Phi_{12}$, which is reflected light) at the semi-reflection film 111, which is provided at the interface between the substrate 11 and the substrate 12. Since the reflectance and transmittance of the semi-reflection films is 50%, the intensity of each of the light fluxes $\Phi_{11}$ and $\Phi_{12}$ is 50% of the intensity of the incident light $\Phi_0$.

The light flux $\Phi_{11}$ is divided into two light fluxes (light flux $\Phi_{21}$, which is transmitted light, and light flux $\Phi_{22}$, which is reflected light) at the semi-reflection film 121, which is provided at the interface between the substrate 12 and the substrate 13. The intensity of each of the light fluxes $\Phi_{21}$ and $\Phi_{22}$ is 25% of the intensity of the incident light $\Phi_0$.

The light flux $\Phi_{21}$ is divided into two light fluxes (light flux $\Phi_{31}$, which is transmitted light, and light flux $\Phi_{32}$, which is reflected light) at the semi-reflection film 131, which is provided at the outer surface of the substrate 13 (lower surface of light guide). The intensity of each of the light fluxes $\Phi_{31}$ and $\Phi_{32}$ is 12.5% of the intensity of the incident light $\Phi_0$. The light flux $\Phi_{31}$ is extracted out of the light guide through the light extracting portion 141. The light flux $\Phi_{32}$ is reflected off the upper surface of the light guide and then extracted out of the light guide through the light extracting portion 142.

No description will be made of the optical paths of the other light fluxes. After repeated reflection at the semi-reflection films, the beam shifters, or the end surfaces of the light guide, eight light fluxes are eventually extracted. Each of the light fluxes is extracted after reflection or transmission three times ($\log_2 N$) at the corresponding semi-reflection films.

As described above, according to the present embodiment, a plurality of light fluxes having the same polarization state, optical intensity, and traveling direction (exiting angle) can be extracted.

2. Second Embodiment

Figure 2:
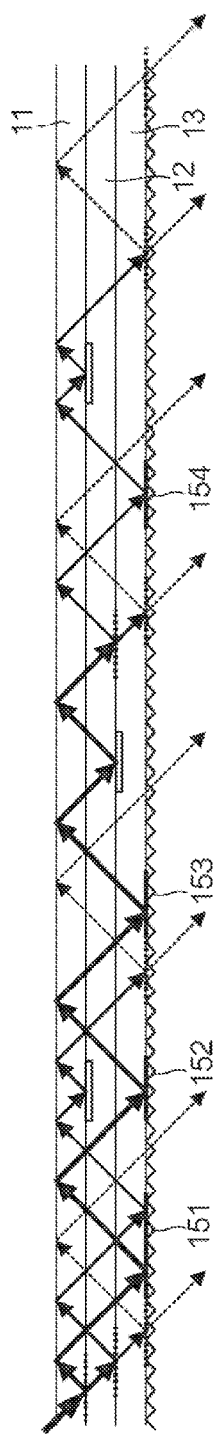
FIG. 2 shows the configuration of a light divider according to a second embodiment.

FIG. 2 shows the configuration of a light divider 2 according to a second embodiment. Elements common to those in the light divider 1 will not be described below. In the light divider 1, the structural components (triangular prisms, for example) are provided on a light extracting portion basis, whereas in the light divider 2, structural components are provided over the entire lower surface of the light guide. Further, total reflection films that totally reflect light fluxes (total reflection films 151 to 154) are formed on the lower surface of the light guide in the portions excluding the light extracting portions. The total reflection films are not necessarily provided on the lower surface of the light guide over the entire portions excluding the light extracting portions but only need to be provided on at least part of the portions excluding the light extracting portions (specifically, portions where light fluxes are desired to be totally reflected).

According to the present embodiment, the structural components that form the light extracting portions can be formed integrally with the light guide, whereby the light extracting portions can be more readily formed than in a case where structural components are machined or molded on a light extracting portion basis. For example, nano-imprinting or any other molding process can be readily used.

3. Third Embodiment

Figure 3:
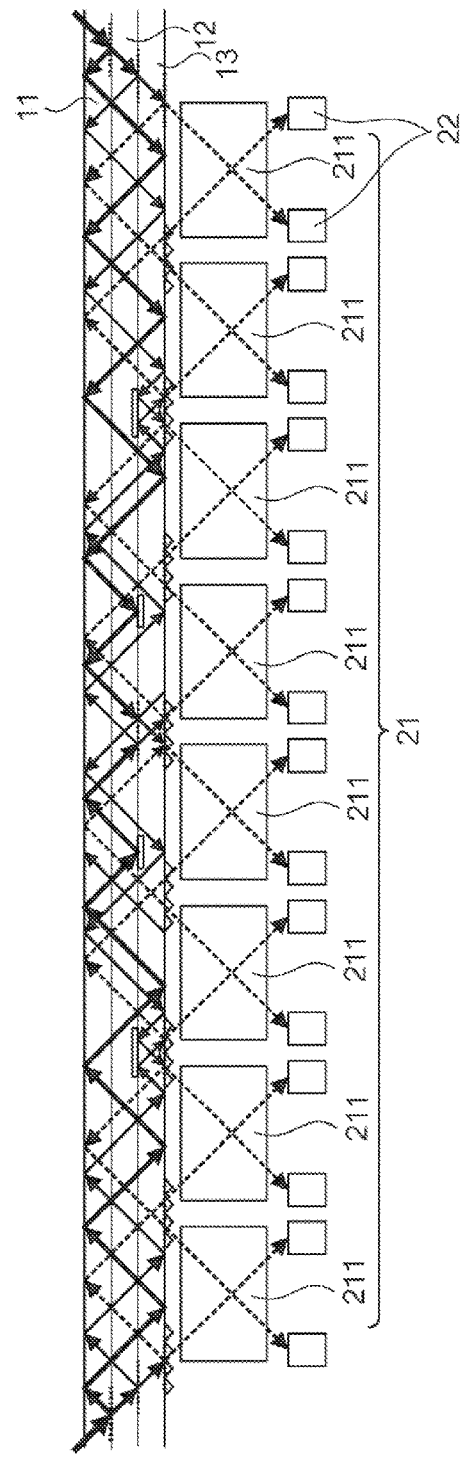
FIG. 3 shows the configuration of a magnetism measurement apparatus according to a third embodiment.

FIG. 3 shows the configuration of a magnetism measurement apparatus 10 according to a third embodiment. In this example, the magnetism measurement apparatus 10 uses nonlinear magneto-optical rotation (NMOR). The magnetism measurement apparatus 10 includes a light divider 3 and a sensor array 20.

The light divider 3 has the same configuration as that of the light divider 1 but differs therefrom in that an incident light flux is incident on the right and left sides of the plane of view and each of the two incident light fluxes is divided into eight light fluxes. In this example, some of the light extracting portions are used for the two incident light fluxes. Specifically, nine light extracting portions are used as follows: The leftmost one is dedicated for the incident light flux from left; the rightmost one is dedicated for the incident light flux from right; and the other light extracting portions are common to the two incident light fluxes.

The sensor array 20 includes a gas cell array 21 and a plurality of polarimeters 22. The gas cell array 21 has a plurality of gas cells 211. Each of the gas cells 211 is a box (cell) having a cavity (internal space) formed therein, and an alkali metal atom (cesium (Cs), for example) that interacts with a magnetic field and light is encapsulated in the cavity. Each of the gas cells 211 is made of quartz glass, borosilicate glass, or any other inorganic material. The alkali metal atom encapsulated in each of the gas cells 211 at least partially vaporizes at the time of measurement. To prolong an alignment relaxation time, which will be described later, a rare gas or any other inert gas may be mixed with the alkali metal gas, or paraffin or any other substance may be coated on the inner wall of each of the gas cells 211.

The polarimeters 22 are attached to the gas cells 211 on a gas cell basis. In detail, each of the polarimeters 22 has a polarization separator and two detectors (neither of them is shown). The polarization separator is an element that separates a light flux incident thereon into two polarized light fluxes polarized in directions perpendicular to each other (first polarized light and second polarized light). The polarization separator is, for example, a Wollaston prism or a polarizing beam splitter. The two detectors are elements that detect the amounts of two polarized light fluxes. One of the two detectors detects the amount of first polarized light, and the other detects the amount of second polarized light. Each of the detectors is, for example, a photodiode.

Light outputted from a light source (laser beam, for example) is divided into eight light fluxes by the light divider 3. The divided light fluxes are incident on the respective different gas cells 211. The light flux propagating through each of the gas cells 211 excites (optically pumps) the alkali metal atom encapsulated in the gas cell 211. The alkali metal atom undergoes spin polarization in accordance with the polarization state of the light flux, reacts with a magnetic field produced in the gas cell 211, and further changes the optical state of the light flux. As a result, the light flux having entered the gas cell 211 receives a linear dichroism effect or any other optically active effect. It is assumed in the description that the magnetic field is relatively so weak that a Larmor precession cycle is longer than the relaxation time of the spin polarization of the alkali metal atom. The light flux having passed through the gas cell 211 is separated by the polarization separator into two polarized light fluxes. The amounts of two polarized light fluxes are detected (measured) with the two respective detectors. In an optical path external to the light divider 3, a polarizer for adjusting the polarization state of each of the polarized light fluxes or a reflection plate for adjusting the optical path thereof may be used.

According to the present embodiment, a light flux outputted from a single light source is divided into a plurality light fluxes, which can be used to measure the distribution of a magnetic field with increased accuracy.

4. Variations

The invention is not limited to the embodiments described above, and a variety of variations are conceivable. Some variations will be described below. Among the following variations, two or more may be combined with each other.

Figure 4:
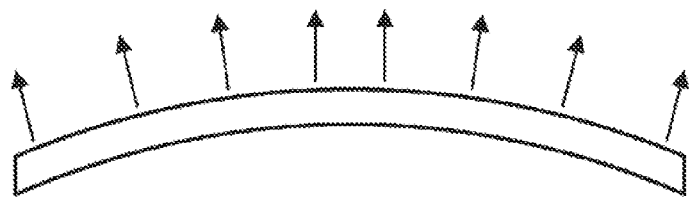
FIG. 4 shows an overview of a light divider according to a variation.

FIG. 4 shows an overview of a light divider 4 according to a variation. A light guide, that is, each substrate that forms the light guide is not necessarily a flat plate. In the example shown in FIG. 4, the light guide is a curved plate. In this example, however, the light incident surface and the light exiting surface of each substrate are parallel to each other, as in the embodiments described above. According to this example, uniform light fluxes are allowed to radially exit out of the light divider.

Figure 5:
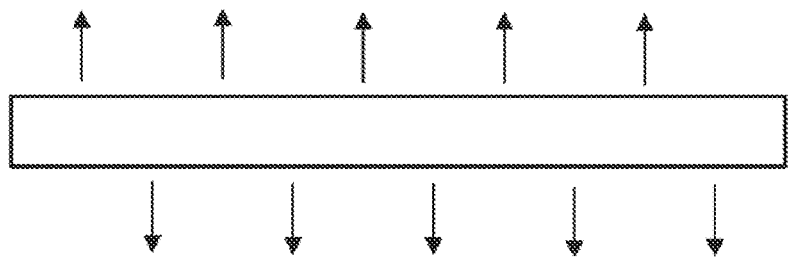
FIG. 5 shows an overview of a light divider according to another variation.

FIG. 5 shows an overview of a light divider 5 according to another variation. In the examples described above, the divided light fluxes exit through a single surface (lower surface of light guide in FIGS. 1 to 3). The divided light fluxes may instead exit through two or more surfaces. According to this example, uniform light fluxes are allowed to exit out of the light divider in different directions.

The interval (distance) between a plurality of light fluxes that exit out of any of the light dividers may not be fixed. Further, the light extracting portions may be two-dimensionally arranged over a surface of the light guide. In this case, a one-dimensional light divider may first divide a light flux emitted from a light source into a plurality of one-dimensionally arranged light fluxes, and a two-dimensional light divider may then divide each of the light fluxes into a plurality of one-dimensionally arranged light fluxes, whereby a plurality of two-dimensionally arranged light fluxes exit out of the entire light divider.

The light guide used in any of the light dividers is not limited to a plurality of substrates bonded to each other. A single substrate having semi-reflection films formed therein may be used as the light guide. In this case, the semi-reflection films are formed, for example, in a single glass substrate by using laser processing.

The light dividers described in the embodiments are not necessarily used in a magnetism measurement apparatus. The light dividers may be used in any apparatus that optically measures a spatial distribution of a physical quantity. The light dividers may, for example, be used in an apparatus that measures distortion of a plate-shaped member, a polarization extinction ratio and an absorptance distribution of a polarizing film, or a spatial distribution of the refractive index or any other physical quantity of a gas. The light dividers may still instead be used in a display apparatus.

What is claimed is:

1. A light divider comprising:
   a light guide having a first surface and a second surface that reflect light incident on the light guide, the light guide causing the light to propagate through a portion between the first surface and the second surface;
   light dividing films that are provided in the light guide and divide the light into transmitted fluxes and reflected fluxes; and
   a plurality of light extracting portions that are provided on the first surface and allow the transmitted fluxes to exit through the first surface,
   wherein
   the light guide has a layer structure including a plurality of layers formed of n layers,
   each of the light dividing films is provided between two adjacent layers of the n layers, and
   among the n layers, a number of light dividing films provided between an (i+1)-th layer and an (i+2)-th layer is twice a number of light dividing films provided between an i-th layer and the (i+1)-th layer.

2. The light divider according to claim 1, further comprising:
   a beam shifter that is provided in the light guide and translates an optical path of the light.

3. The light divider according to claim 1, further comprising:
   a structural component that is provided over an entirety of the first surface and extracts light fluxes having propagated through the light guide; and
   reflection films that are provided on the first surface in at least part of portions excluding the plurality of light extracting portions.

4. The light divider according to claim 1,
   wherein each of the plurality of light extracting portions is formed of a set of a plurality of structural components that extract a light flux having propagated through the light guide, and
   the sets of plurality of structural components are arranged at equal intervals.

5. A magnetism measurement apparatus comprising:
   a light guide having a first surface and a second surface that reflect light incident on the light guide, the light guide causing the light to propagate through a portion between the first surface and the second surface;
   light dividing films that are provided in the light guide and divide the light into transmitted fluxes and reflected fluxes;
   a plurality of light extracting portions that are provided on the first surface and allow the transmitted fluxes to exit through the first surface; and
   a plurality of gas cells provided in positions corresponding to the plurality of light extracting portions, each of the plurality of gas cells encapsulating a gas that interacts with a magnetic field and a light flux extracted through the corresponding light extracting portion,
   wherein
   the light guide has a layer structure including a plurality of layers formed of n layers,
   each of the light dividing films is provided between two adjacent layers of the n layers, and
   among the n layers, a number of light dividing films provided between an (i+1)-th layer and an (i+2)-th layer is twice a number of light dividing films provided between an i-th layer and the (i+1)-th layer.

* * * * *